US012213344B2

United States Patent
Tang et al.

(10) Patent No.: US 12,213,344 B2
(45) Date of Patent: Jan. 28, 2025

(54) DISPLAY DEVICES, DISPLAY SUBSTRATES THEREOF AND MANUFACTURING METHODS OF DISPLAY SUBSTRATE

(71) Applicant: KunShan Go-Visionox Opto-Electronics Co., Ltd., Kunshan (CN)

(72) Inventors: Jingsong Tang, Kunshan (CN); Chao Liang, Kunshan (CN); Yufei Xia, Kunshan (CN); Guosheng Tao, Kunshan (CN); Rusheng Liu, Kunshan (CN)

(73) Assignee: KunShan Go-Visionox Opto-Electronics Co., Ltd., Kunshan (CN)

(*) Notice: Subject to any disclaimer, the term of this patent is extended or adjusted under 35 U.S.C. 154(b) by 661 days.

(21) Appl. No.: 17/361,775

(22) Filed: Jun. 29, 2021

(65) Prior Publication Data

US 2021/0327980 A1  Oct. 21, 2021

Related U.S. Application Data

(63) Continuation of application No. PCT/CN2020/072510, filed on Jan. 16, 2020.

(30) Foreign Application Priority Data

Jun. 28, 2019 (CN) .......................... 201910580333.9
Jun. 28, 2019 (CN) .......................... 201910580345.1

(51) Int. Cl.
*H10K 59/122* (2023.01)
*H10K 59/173* (2023.01)
(Continued)

(52) U.S. Cl.
CPC ......... *H10K 59/122* (2023.02); *H10K 59/173* (2023.02); *H10K 71/00* (2023.02); *H10K 71/231* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 10,074,705 | B2 | 9/2018 | Chung et al. |
| 2017/0330923 | A1 | 11/2017 | Chung et al. |

(Continued)

FOREIGN PATENT DOCUMENTS

| | | | |
|---|---|---|---|
| CN | 1942031 A | | 4/2007 |
| CN | 1992333 A | | 7/2007 |

(Continued)

OTHER PUBLICATIONS

Office Action and Search Report issued on Feb. 3, 2021 in corresponding Chinese application No. 201910580333.9; 22 pages including Machine-generated English Translation.

(Continued)

*Primary Examiner* — Michelle Mandala
(74) *Attorney, Agent, or Firm* — Maier & Maier, PLLC

(57) ABSTRACT

A display device, a display substrate, and a manufacturing method thereof. The display substrate includes a display region including a transparent display region. The transparent display region includes a first substrate, first sub-pixels, a first pixel definition layer, and partition layers. The first substrate is part of a light-transmitting substrate and includes first pixel regions and first non-pixel regions alternately distributed. The first sub-pixels are disposed in the first pixel regions, and each include, from bottom to top, a first electrode, a first light-emitting structure layer, and a second electrode. The first pixel definition layer is disposed in the (Continued)

first non-pixel regions and provided with openings. The partition layers are disposed in the first non-pixel regions, and each include a first section disposed on the first pixel definition layer and a second section suspended above a corresponding opening to partition second electrodes of adjacent first pixel regions.

14 Claims, 18 Drawing Sheets

(51) Int. Cl.
*H10K 71/00* (2023.01)
*H10K 71/20* (2023.01)
*H10K 102/00* (2023.01)

(56) References Cited

U.S. PATENT DOCUMENTS

| | | | |
|---|---|---|---|
| 2018/0090706 A1 | 3/2018 | Ushikubo | |
| 2018/0375050 A1* | 12/2018 | Ito | H10K 50/15 |
| 2021/0028249 A1* | 1/2021 | Ding | H01L 27/1288 |

FOREIGN PATENT DOCUMENTS

| | | |
|---|---|---|
| CN | 101304076 A | 11/2008 |
| CN | 102376747 A | 3/2012 |
| CN | 104885251 A | 9/2015 |
| CN | 106803514 A | 6/2017 |
| CN | 107394057 A | 11/2017 |
| CN | 107394061 A | 11/2017 |
| CN | 108803161 A | 11/2018 |
| CN | 109004106 A | 12/2018 |
| CN | 109166900 A | 1/2019 |
| CN | 109346505 A | 2/2019 |
| CN | 109545833 A | 3/2019 |
| CN | 109801950 A | 5/2019 |
| CN | 110265469 A | 9/2019 |
| CN | 110289300 A | 9/2019 |

OTHER PUBLICATIONS

Office Action and Search Report issued on Jan. 6, 2021 in corresponding Chinese application No. 201910580345.1; 10 pages including Machine-generated English Translation.
International Search Report issued on Apr. 8, 2020 in corresponding International application No. PCT/CN2020/072510; 6 pages.
Written Opinion of the International Searching Authority issued on Apr. 8, 2020 in corresponding International application No. PCT/CN2020/072510; 7 pages including Partial English Translation.

* cited by examiner

DISPLAY DEVICES, DISPLAY SUBSTRATES THEREOF AND MANUFACTURING METHODS OF DISPLAY SUBSTRATE

CROSS-REFERENCE TO RELATED APPLICATION

This application is a continuation application of International Application No. PCT/CN2020/072510 filed on Jan. 16, 2020, which claims priority to Chinese patent applications No. 201910580345.1 filed on Jun. 28, 2019, and Chinese patent application No. 201910580333.9 filed on Jun. 28, 2019. All of the applications are incorporated herein by reference in their entireties.

TECHNICAL FIELD

The present disclosure relates to the technical field of display devices, and in particular to a display device, a display substrate thereof, and a manufacturing method of the display substrate.

BACKGROUND

With rapid development of display devices, users have increasingly higher requirements on screen-to-body ratio. Since components such as cameras, sensors and earpieces are generally installed at the top of a screen, a part of the top of the screen is usually reserved for installing these components, for example, the "notch" area of iPhone X, which affects the overall consistency of the screen. Therefore, full-screen display has attracted more and more attention from the industry.

SUMMARY

The objective of the present application is to provide a display device for full screen display, a display substrate thereof, and a manufacturing method of the display substrate.

In order to achieve the above objective, according to a first aspect of the present disclosure, a display substrate is provided. The display substrate includes a display region. The display region includes a transparent display region. The transparent display region includes a first substrate, first sub-pixels, a first pixel definition layer, and partition layers. The first substrate is a part of a light-transmitting substrate and includes a plurality of first pixel regions and a plurality of first non-pixel regions alternately distributed. The first sub-pixels are disposed in the first pixel region, and each of the first sub-pixels includes, from bottom to top, a first electrode, a first light-emitting structure layer disposed on the first electrode, and a second electrode disposed on the first light-emitting structure layer. The first pixel definition layer is disposed in the first non-pixel regions and provided with a plurality of openings. The partition layer are disposed in the first non-pixel regions, the partition layers each include a first section and a second section, the first section is disposed on the first pixel definition layer, and the second section is suspended above a corresponding one of the openings to partition second electrodes of adjacent first pixel regions.

According to a second aspect of the present disclosure, a display device is provided. The display device includes: a device body with a component region, and a display panel covering the device body; the display panel includes any one of the above-mentioned display substrate, where the component region is disposed below a transparent display region of the display panel, and one or more photosensitive components that emit or collect light through the transparent display region are arranged in the component region.

According to a third aspect of the present disclosure, a manufacturing method of the display substrate is provided. The method includes: providing a semiconductor structure comprising providing a light-transmitting substrate comprising a first substrate provided with a plurality of first pixel regions and a plurality of first non-pixel regions alternately distributed in the display region, forming a plurality of pixel electrodes on the light-transmitting substrate, the pixel electrodes comprising first electrodes disposed in the first pixel regions, and forming a pixel definition layer on the pixel electrodes, the pixel definition layer including a first pixel definition layer disposed in the first non-pixel regions; forming a plurality of partition layers on the first pixel definition layer, and forming an etching opening in each of the partition layers; forming a patterned mask layer on the partition layers and a part of the first electrodes and a part of the first pixel definition layer which are not covered by the partition layers, and the patterned mask layer exposes the etching openings; etching the first pixel definition layer with the patterned mask layer as a mask to form openings to suspend a part of each of the partition layers; removing the patterned mask layer; forming a light-emitting structure layer on the pixel electrodes, the light-emitting structure layer includes a first light-emitting structure layer formed on the first electrodes; vapor-depositing a conductive material layer, where the conductive material layer includes a plurality of second electrodes formed by being separated by the partition layers.

The beneficial effects of the present disclosure are:
In the transparent display region, the first pixel definition layer between adjacent first sub-pixels is provided with an opening, and a partition layer outside the opening. The partition layer includes a first section and a second section. The first section is disposed on the first pixel definition layer, and the second section is suspended above the opening for separating second electrodes of adjacent first pixel regions. The suspended partition layer has a good isolation effect on the conductive material, and second electrodes of adjacent first sub-pixels will not be electrically connected with each other. In addition, a film structure of the transparent display region is simplified, which can reduce the diffraction problem when imaging through the transparent display region.

DETAILED DESCRIPTION OF THE EMBODIMENTS

In order to make the above objectives, features and advantages of the present application more apparent and understandable, specific embodiments of the present application will be described in detail below with reference to the drawings.

Figure 1:
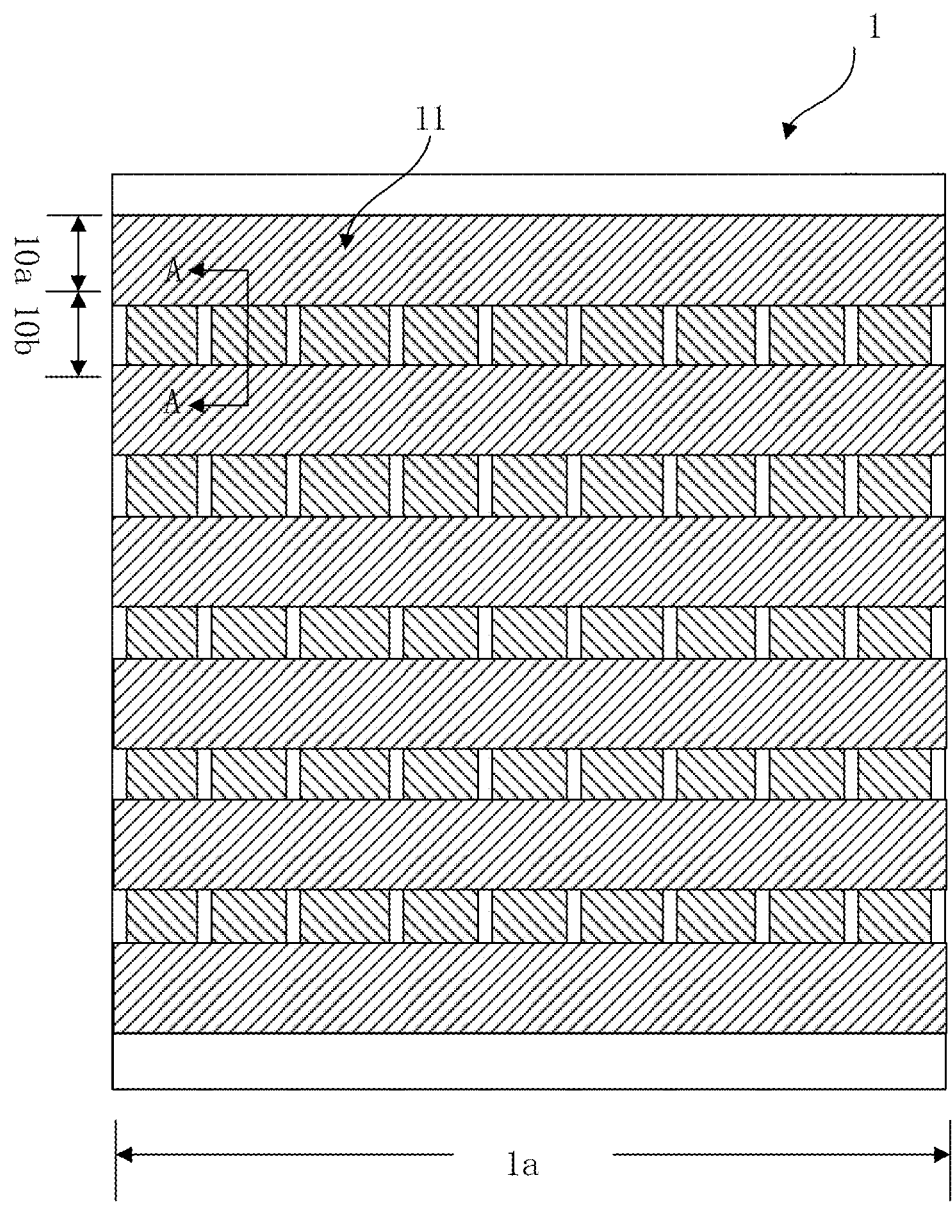
FIG. 1 is a top view of a display substrate corresponding to a transparent display region in an embodiment of the present application, in which a conductive material layer on a light-transmitting substrate and at an edge of the transparent display region is removed, and a first pixel definition layer is represented as a transparent layer.
Figure 2A:
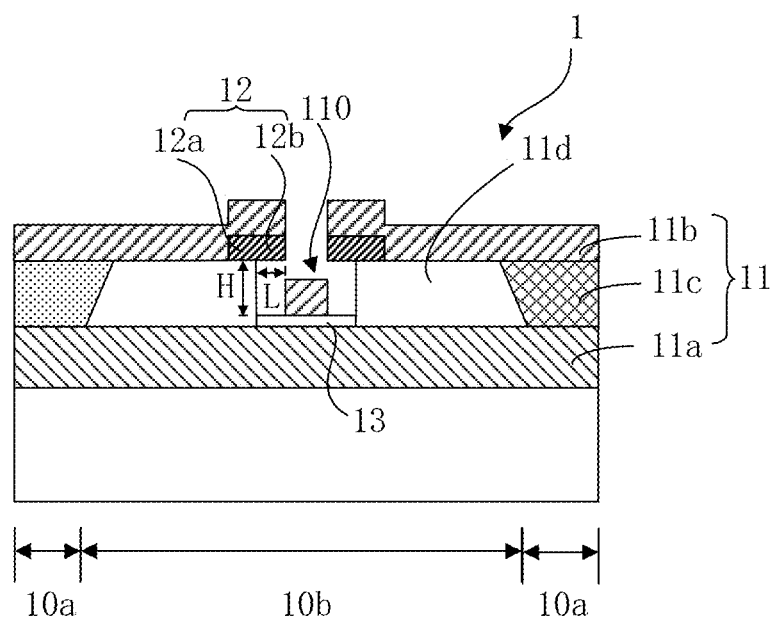
FIG. 2a is a cross-sectional view taken along line A-A in FIG. 1.
Figure 2B:
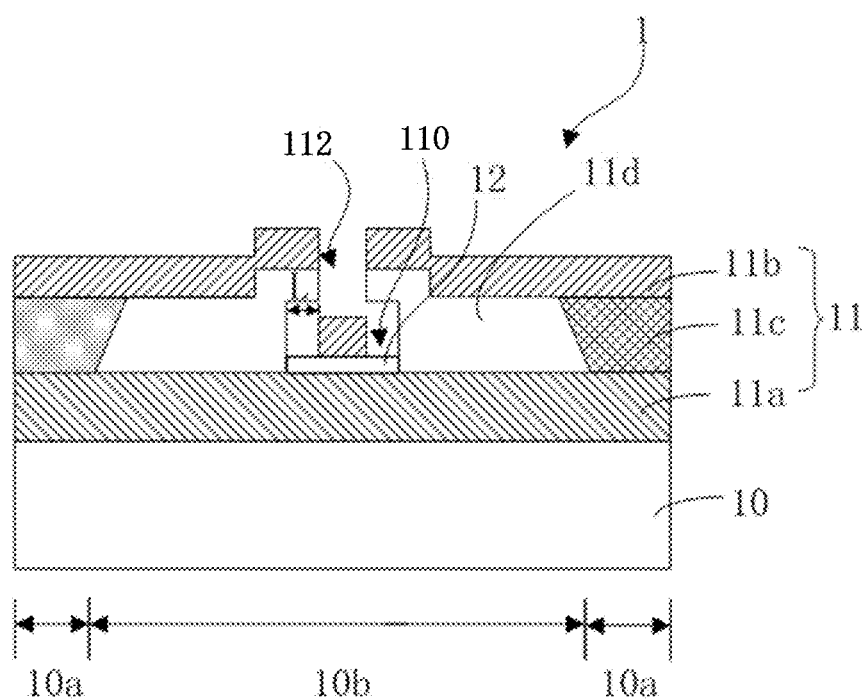
FIG. 2b is a cross-sectional view when a partition layer is part of the first pixel definition layer.
Figure 3:
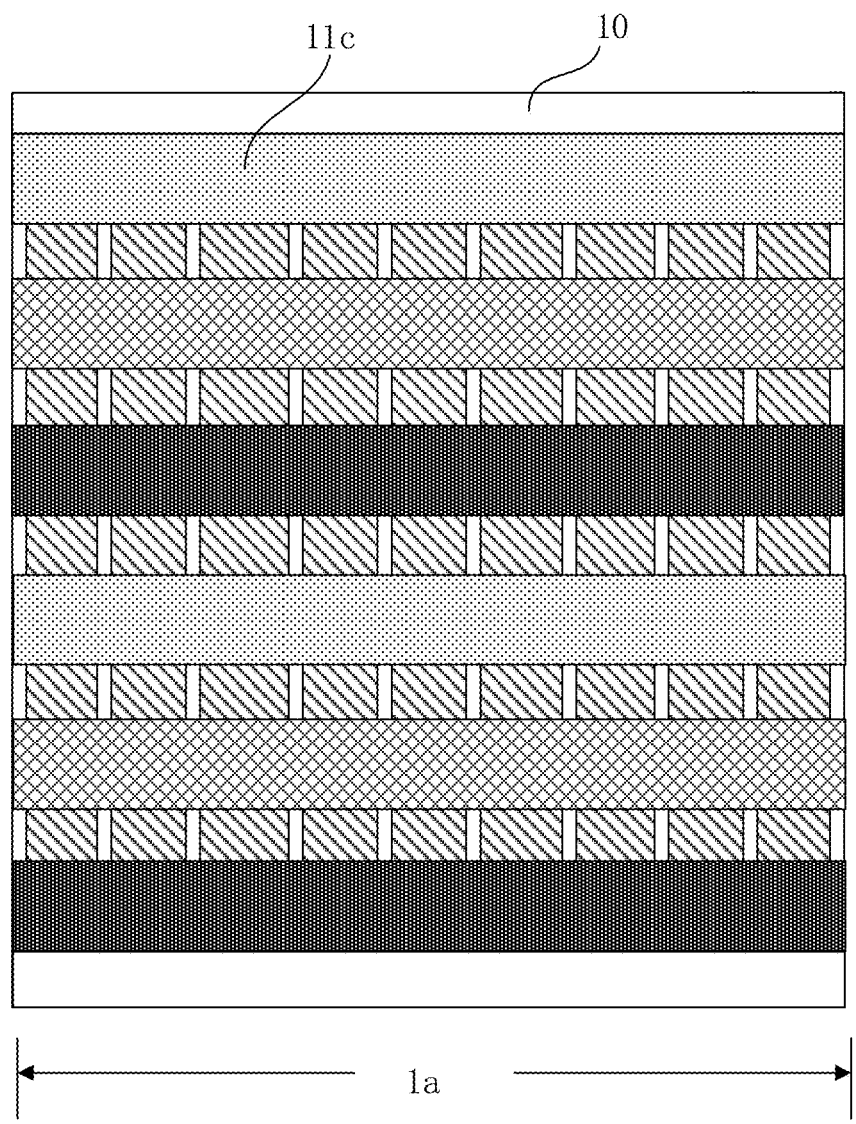
FIG. 3 is a schematic diagram of the display substrate in FIG. 1 after removing second electrodes.
Figure 4:
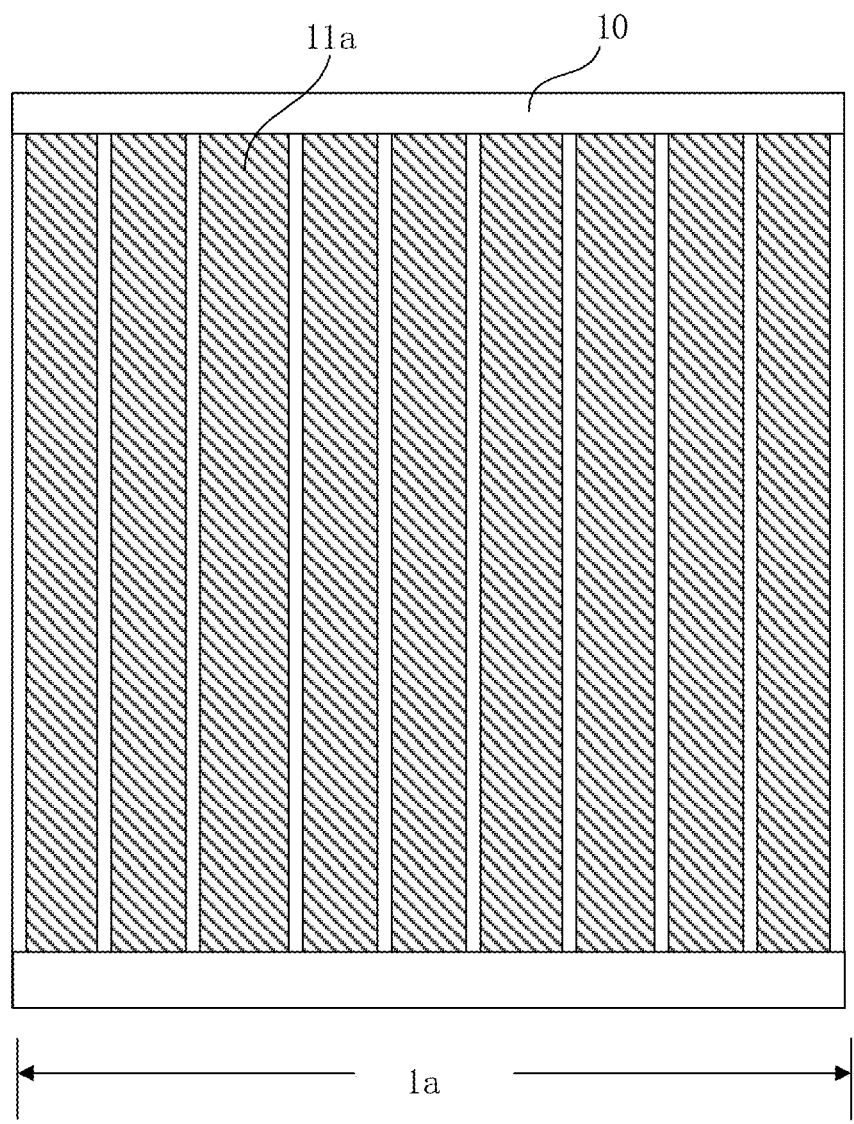
FIG. 4 is a schematic diagram of first electrodes of the display substrate in FIG. 1.

FIG. 1 is a top view of a display substrate corresponding to a transparent display region in an embodiment of the present application, in which a conductive material layer above a light-transmitting substrate and at an edge of the transparent display region is removed/not shown, and a first pixel definition layer is represented as a transparent layer. FIG. 2*a* is a cross-sectional view taken along line A-A in FIG. 1. FIG. 2*b* is a cross-sectional view when a partition layer in FIG. 2*a* is a part of the first pixel definition layer. FIG. 3 is a schematic diagram of the structure of the display substrate in FIG. 1 after removing second electrodes. FIG. 4 is a diagram depicting distribution of first electrodes of the display substrate in FIG. 1. For example, a portion marked as a first substrate 10 in FIGS. 3 and 4 is shown with the conductive material layer at an edge of the transparent display region removed. In the present disclosure, "transverse direction" refers to a direction along the plane where the first substrate is disposed, and "longitudinal direction" refers to a direction of the thickness of the first substrate.

The present disclosure provides a display substrate including a display region. The display region includes a transparent display region. The transparent display region includes a first substrate, a plurality of first sub-pixels, a first pixel definition layer, and a plurality of partition layers. The first substrate is a part of a light-transmitting substrate and includes a plurality of first pixel regions and a plurality of first non-pixel regions alternately distributed. The first sub-pixels are disposed in the first pixel regions, and each of the first sub-pixels includes, from bottom to top, a first electrode, a first light-emitting structure layer disposed on the first electrode, and a second electrode disposed on the first light-emitting structure layer. The first pixel definition layer is disposed in the first non-pixel regions and provided with a plurality of openings.

The partition layers are disposed in the first non-pixel regions and each of the partition layers includes a first section and a second section. The first section is disposed on the first pixel definition layer, and the second section is suspended above a corresponding one of the openings, so that second electrodes of adjacent first pixel regions are partitioned. In this way, the suspended partition layers have a good isolation effect on the conductive material, and second electrodes of adjacent first sub-pixels will not be electrically connected with each other. In addition, a film structure of the transparent display region is simplified, which can reduce the diffraction problem when imaging through the transparent display region.

Referring to FIGS. 1, 2*a*, 3 and 4, the display substrate 1 includes a transparent display region 1*a*. The transparent display region 1*a* includes: a first substrate 10 including a plurality of first pixel regions 10*a* and a plurality of first non-pixel regions 10*b* alternately distributed; first sub-pixels 11 disposed in the plurality of first pixel regions 10*a*, each of the first sub-pixels 11 including a first electrode 11*a*, a first light-emitting structure layer 11*c*, and a second electrode 11*b* from bottom to top; and first pixel definition layers 11*d* and partition layers 12 disposed in the plurality of first non-pixel regions 10*b*. In a non-pixel region, a first pixel definition layer 11*d* is provided with an opening 110 and each of one or more partition layers 12 includes a first section 12*a* and a second section 12*b*. The first section 12*a* is disposed on the first pixel definition layer 11*d*, and the second section 12*b* is suspended over the opening 110. A first aperture is formed between two adjacent second sections and configured to partition second electrodes 11*b* of adjacent first pixel regions 10*a*.

As shown in FIG. 2*b*, when the partition layers 12 are part of the first pixel definition layer, a first aperture 112 is formed between the partition layers 12, and the opening 110 communicates with the first aperture 112. A transverse size of the first aperture 112 is smaller than a transverse size of the opening 110.

The first substrate 10 may be a flexible substrate or a rigid substrate. A material of the flexible substrate may be polyimide, and the material of the rigid substrate may be glass.

The first electrode 11*a* may be one of an anode and a cathode, and the second electrode 11*b* is the other one of anode and cathode. A material of the first electrode 11*a* is a light-transmitting material. A material of the second electrode 11*b* is a material that is partially light-transmitting and partially reflective. The first light-emitting structure layer 11*c* may be an OLED (Organic Light Emitting Diode) layer. Referring to FIG. 3, the first light-emitting structure layers 11*c* may be red, green, or blue and alternately distributed. In other optional embodiments, the first light-emitting structure layers 11c may be red, green, blue, or yellow and alternately distributed, or may be of a same color.

When a driving voltage is applied between the first electrode 11a and the second electrode 11b of each of the first sub-pixels 11, the transparent display region 1a performs a display function. When no driving voltage is applied between the first electrode 11a and the second electrode 11b of each of the first sub-pixels 11, the transparent display region 1a performs a light-transmitting function.

The first sub-pixel 11 may emit light in an active matrix (AM) driving mode or a passive matrix (PM) driving mode. When emitting light in an AM driving mode, the first electrode 11a and the second electrode 11b of the first sub-pixel 11 may both be electrode blocks, or one of them may be an electrode block and the other may be a planar electrode. When emitting light in a PM driving mode, the first electrodes 11a and the second electrodes 11b may be electrode strips, which respectively extend in a row direction and a column direction, and an intersection of a row and a column is one first sub-pixel 11.

The display substrate 1 corresponding to the transparent display region 1a of the embodiments shown in FIGS. 1 to 4 emits light in a PM driving mode. In FIGS. 1 and 4, the first electrodes 11a of the first sub-pixels 11 in one column can be connected together, and the second electrodes 11b of the first sub-pixels 11 in one row can be connected together. First electrodes 11a in one column are connected to form an electrode strip, and second electrodes 11b in one row are also connected to form an electrode strip. The first pixel regions 10a and the first non-pixel regions 10b extend along the row direction and are alternately distributed along the column direction. The first electrodes and the second electrodes can also be electrically connected in other ways.

Referring to FIGS. 1 to 3, the partition layers 12 and the openings 110 in the first non-pixel regions 10b both extend along the row direction.

In other optional embodiments, the first electrodes 11a of the first sub-pixels 11 in one row may be connected together, and the second electrodes 11b of the first sub-pixels 11 in one column may be connected together. At this time, in a first non-pixel region 10b, the partition layers 12 and the opening 110 extend in the column direction. The first pixel regions 10a and the first non-pixel regions 10b extend along the column direction and are alternately distributed along the row direction.

In FIG. 2a, the opening 110 penetrates the first pixel definition layer 11d in a longitudinal direction. The deeper the opening 110 is, the better the partition effect on a vapor-deposited conductive material layer can be. However, in other embodiments, the opening 110 may partially penetrate the first pixel definition layer in the longitudinal direction. In FIG. 2b, in a same first non-pixel region 10b, an orthographic projection of the first aperture 112 on the first substrate 10 is within an orthographic projection of the opening 110 on the first substrate 10. In this way, when vapor depositing a conductive material layer to form the second electrodes 11b, the conductive material layer falling on/above the first substrate 10 through the first aperture 112 is not connected with the conductive material layer outside the opening 110 and the first aperture 112. In other words, since there is a gap between the conductive material layer falling on/above the first substrate 10 through the first aperture 112 and sidewalls of the opening 110, the conductive material layer falling on/above the first substrate 10 cannot be connected with the conductive material layer outside the opening.

Research shows that in FIGS. 2a and 2b, when a distance L between orthographic projections on the first substrate 10 of a sidewall of the first aperture 112 and a sidewall of the opening 110 that are adjacent to a same first pixel region 10a ranges from 0.5 to 3.5 µm, for most kinds of conductive materials, it can be ensured that the conductive material layer falling on/above the first substrate 10 and the conductive material layer outside both the first aperture 112 and the opening 110 are not connected.

In FIGS. 2a and 2b, a lowest part of a bottom of the opening 110 is an upper surface of an insulating layer 13, so a depth H of the opening 110 (a height difference between an upper edge of the opening 110 and the lowest part of the bottom of the opening) may be greater than a thickness of the second electrode 11b, and the range of the depth H may be 300 nm to 750 nm. In an embodiment, H is greater than 400 nm. In other embodiments, when the lowest part of the bottom of the opening 110 is an upper surface of the first substrate 10, the depth H of the opening 110 is greater than a sum of thicknesses of the first electrode 11a and the second electrode 11b. With this embodiment, the conductive material layer falling on/above the upper surface of the first substrate 10 can be prevented from adhering to the conductive material layer outside the first aperture 112, thereby ensuring separation of second electrodes 11b of adjacent first sub-pixels 11.

In other optional embodiments, for a display substrate that emits light in an AM driving mode, since the first non-pixel regions 10b are not provided with the first electrodes 11a or the first electrodes 11a on the first substrate 10 is an entire planar electrode, the depth of the openings 110 may be greater than the thickness of the second electrodes 11b. In addition, in a same first non-pixel region 10b, the orthographic projection of the first aperture 112 on the first substrate 10 and the orthographic projection of the opening 110 on the first substrate 10 may partially overlap, that is, the vapor-deposited conductive material layer may be partition on at least one sidewall of the first aperture 112.

In FIGS. 2a and 2b, in order to prevent the conductive material layer falling on the first substrate 10 from electrically connecting the electrode strips formed by the first electrodes 11a of each column, for example, the electrode strips have a same width in the extending direction, an insulating layer 13 is provided on the electrode strips in the first non-pixel region 10b. A material of the insulating layer 13 may be at least one of silicon dioxide or silicon nitride.

Research shows that in FIG. 2a, a range of a length L of the second section 12b is: 0.5 µm-3.5 µm. In an embodiment, the range of the length is 1 µm-2 µm. For most kinds of conductive materials, it can be ensured that the conductive material layer falling on/above the first substrate 10 is not connected with the conductive material layer outside the opening 110, and is not connected with the conductive material layer outside the first aperture 112 shown in FIG. 2b. In an embodiment, a range of a thickness of the second section 12b is 50 nm to 100 nm. On one hand, supporting force of the partition layers 12 can be ensured, on the other hand, conductive material adhered to the sidewall of the partition layers 12 can be reduced.

A material of the first pixel definition layer 11d may be an inorganic transparent material or an organic transparent material. The inorganic transparent material or the organic transparent material does not affect a light transmittance of the transparent display region 1a. The inorganic transparent material may be silicon dioxide or silicon nitride, and the organic transparent material may be polyimide.

In FIG. 1, the transparent display region 1a is rectangular. In other optional embodiments, the transparent display region 1a may be drop-shaped, circular, oval, or notch-shaped.

An embodiment of the present application further provides a manufacturing method of a display substrate 4 described below, where the display substrate 4 includes a display region.

Figure 5:
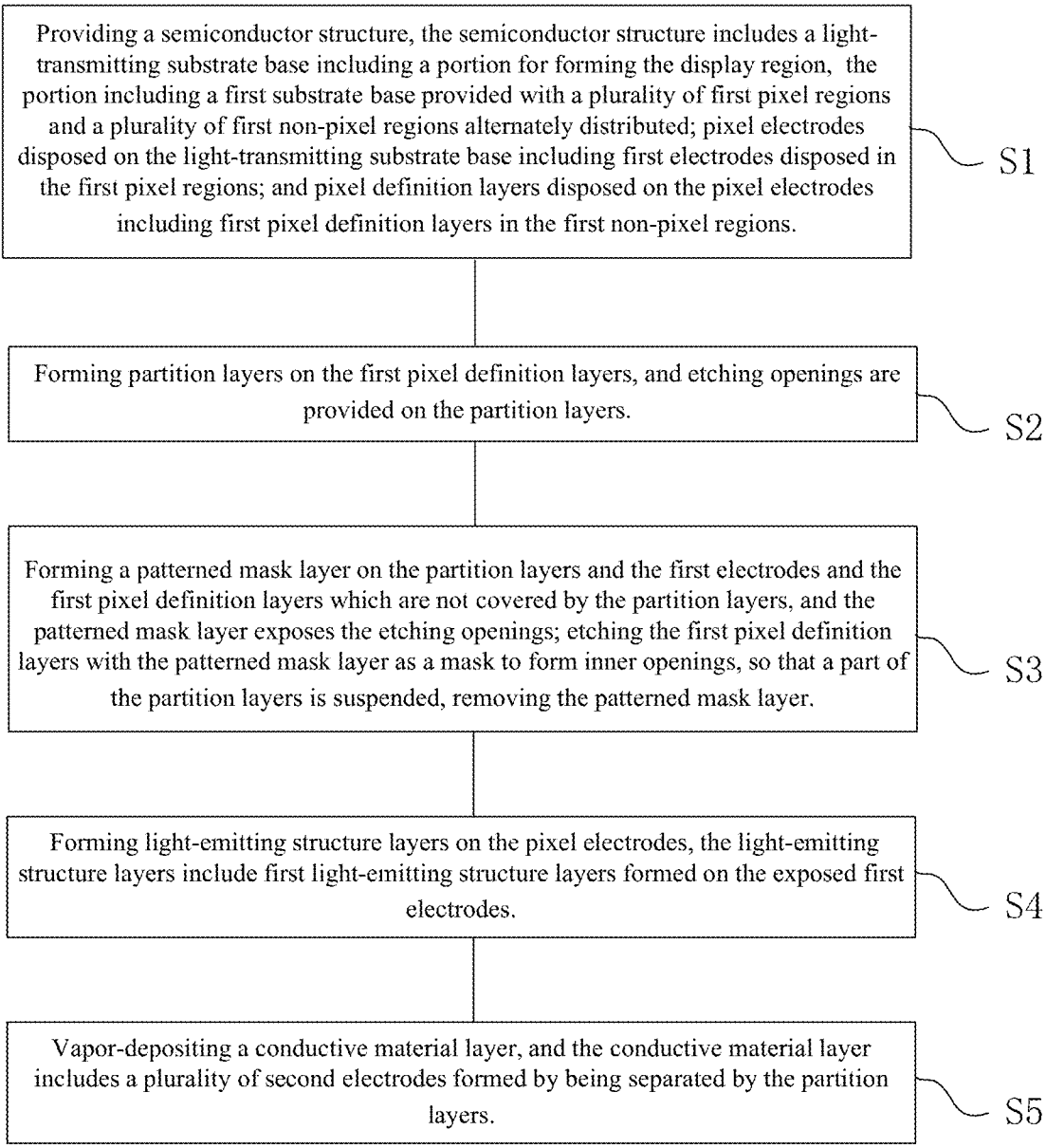
FIG. 5 is a flowchart showing a manufacturing method of the display substrate according to an embodiment of the present application.

FIG. 5 is a flow chart of the manufacturing method. FIGS. 6 to 11 are schematic diagrams of intermediate structures corresponding to the processes in FIG. 5.

Figure 6:
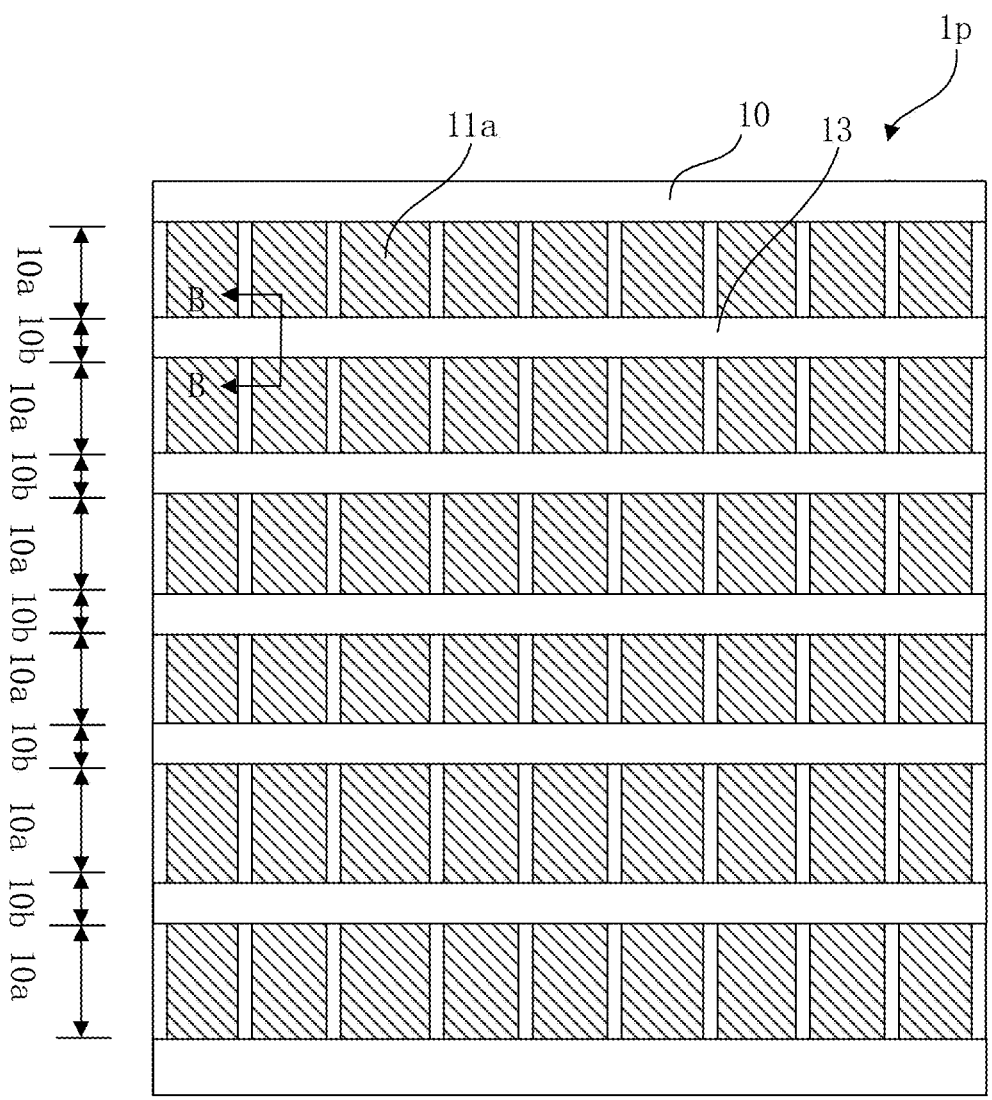
FIG. 6 is a schematic diagrams of intermediate structures corresponding to the processes in FIG. 5.
Figure 7:
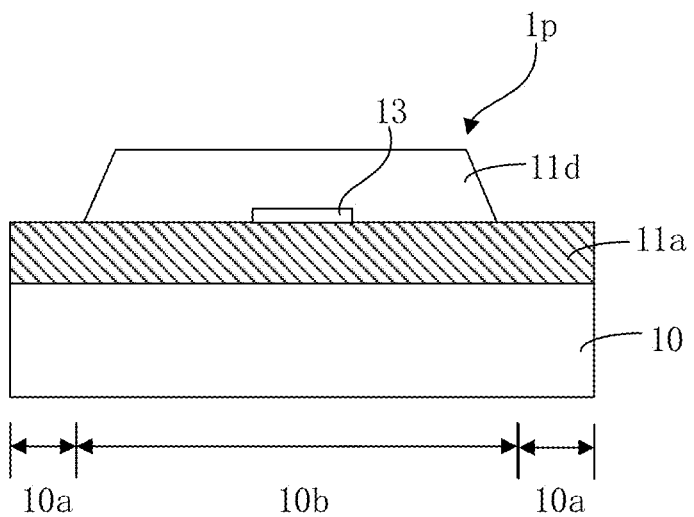
FIG. 7 is a schematic diagram of intermediate structures corresponding to the processes in FIG. 5.
Figure 22:
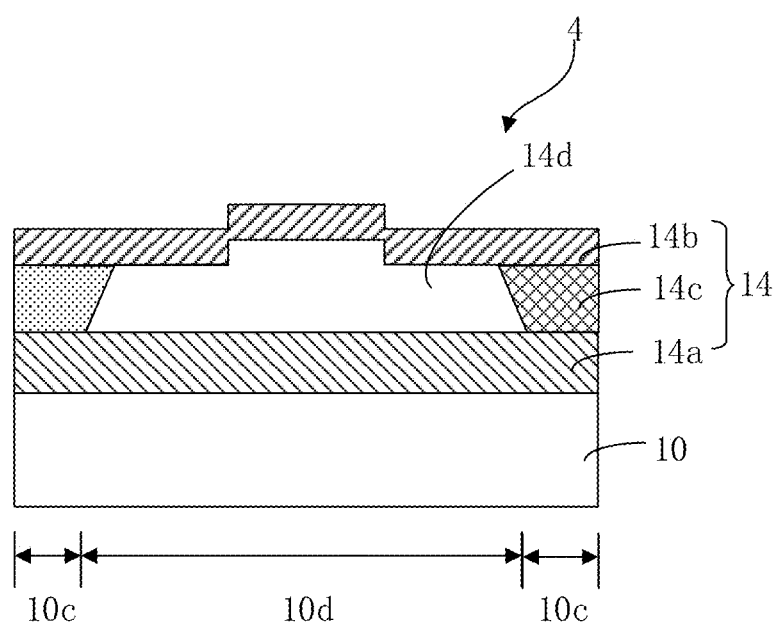
FIG. 22 is a schematic diagram of a partial cross-sectional structure of a non-transparent display region.

First, referring to the step S1 in FIG. 5, and as shown in FIGS. 6 and 7, a semiconductor structure 1p is provided. The semiconductor structure 1p includes a light-transmitting substrate including a portion for forming a display region, the portion including a first substrate 10 provided with a plurality of first pixel regions 10a and a plurality of first non-pixel regions 10b alternately distributed; pixel electrodes disposed on the light-transmitting substrate including first electrodes 11a disposed in the first pixel regions 10a; and pixel definition layers disposed on the pixel electrodes including first pixel definition layers 11d in the first non-pixel regions 10b. The light-transmitting substrate further includes a second substrate 15 described below (as shown in FIG. 22).

FIG. 7 is a cross-sectional view taken along line BB in FIG. 6.

The light-transmitting substrate may be a flexible substrate or a rigid substrate. A material of the flexible substrate may be polyimide, and the material of the rigid substrate may be glass.

The first pixel regions 10a are configured to form first sub-pixels thereon, and the first non-pixel regions 10b are configured to form a film layer defining the first sub-pixels.

In this embodiment, the manufactured display substrate 1 (that is, the portion corresponding to the first substrate 10) emits light in a PM driving mode. Therefore, the first pixel regions 10a and the first non-pixel regions 10b shown in FIG. 6 all extend along the row direction and are alternately distributed along the column direction. The first electrodes 11a in one column may be connected together to form an electrode strip, or a connecting line may be formed between adjacent first electrodes 11a in one column. The first pixel definition layers 11b extend along the row direction and cover the electrode strips in the first non-pixel regions 10b. In other embodiments, the first pixel regions 10a and the first non-pixel regions 10b may extend along the column direction and are alternately distributed along the row direction. The first electrodes 11a in one row may be connected together to form an electrode strip, or a connecting line may be formed between adjacent first electrodes 11a in one row. The first pixel definition layers 11b extend along the column direction and cover the electrode strips in the first non-pixel regions 10b. Alternatively, the display substrate 1 emits light in an AM driving mode, and the first pixel regions 10a and the first non-pixel regions 10b are block-shaped regions, which are alternately distributed in the row direction and the column direction. The first electrodes 11a may be electrode blocks or an entire planar electrode.

Before forming the first pixel definition layers 11b, insulating layers 13 are formed at least on, for example, a part of the electrode strips in the first non-pixel regions 10b. A material of the insulating layers 13 may be at least one of silicon dioxide or silicon nitride. The insulating layers 13 can be patterned by depositing a sacrificial material layer on the entire surface, and then performing dry etching or wet etching. In order to simplify a mask structure used in patterning, the insulating layers 13 in the first non-pixel region 10b of each row can be reserved.

For a display substrate that emits light in an AM driving mode, the production of the insulating layer 13 can be omitted.

The material of the first electrodes 11a may be a light-transmitting conductive material such as indium tin oxide (ITO). The first electrodes 11a can be patterned by depositing a light-transmitting conductive material on an entire surface, and then performing dry etching or wet etching.

A material of the first pixel definition layers 11b may be an inorganic material or organic material, such as silicon dioxide, silicon nitride, or polyimide.

Figure 8:
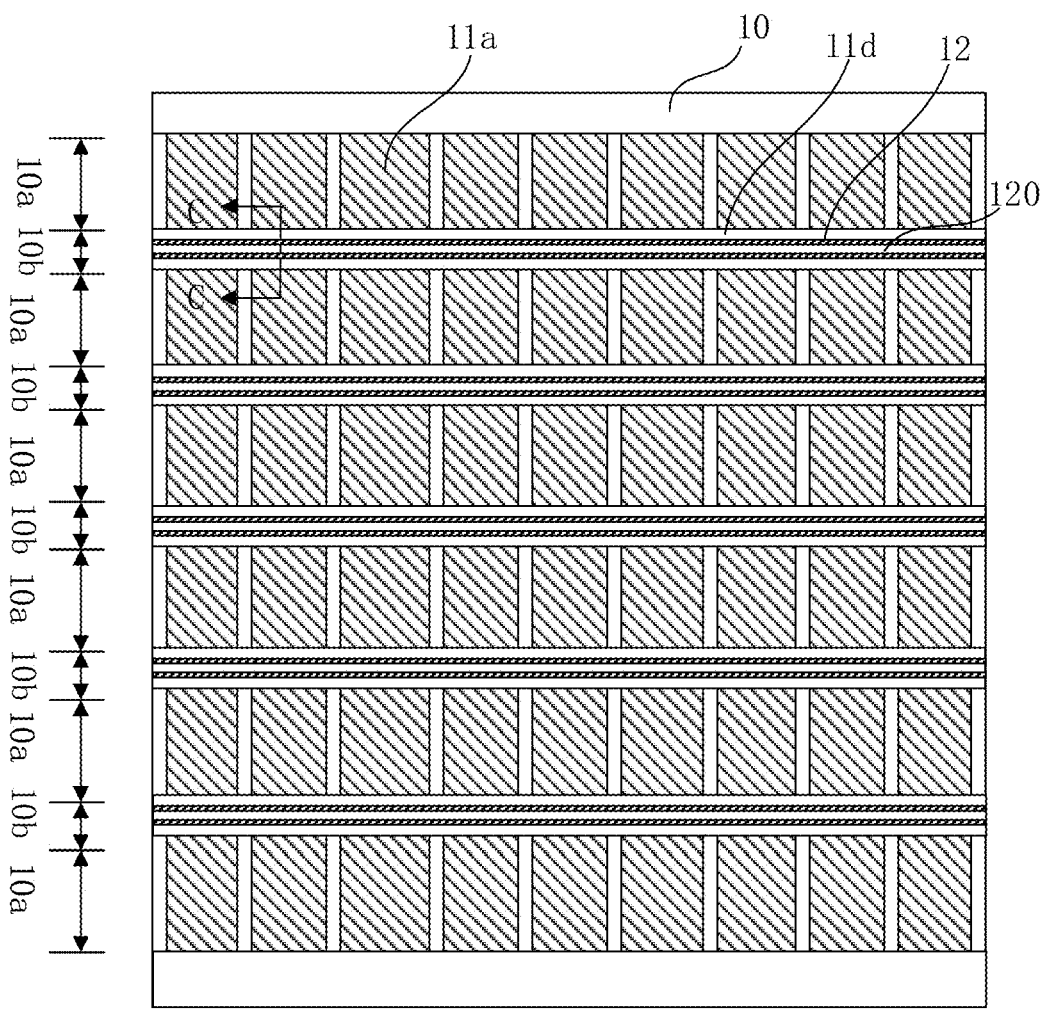
FIG. 8 is a schematic diagram of intermediate structures corresponding to the processes in FIG. 5.
Figure 9:
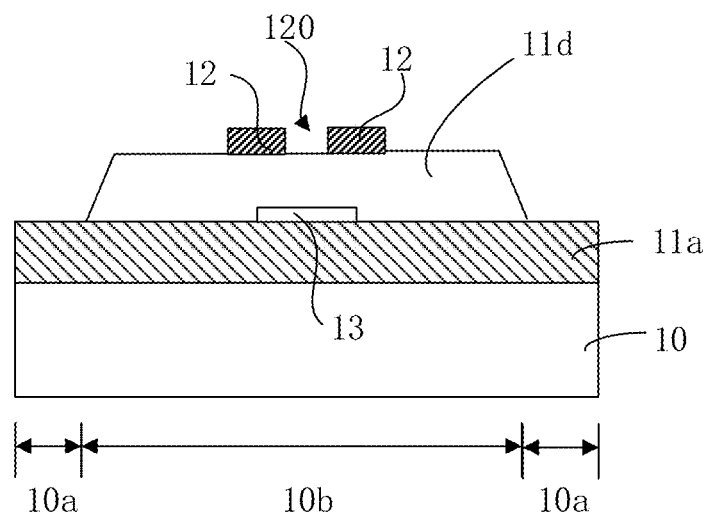
FIG. 9 is a schematic diagram of intermediate structures corresponding to the processes in FIG. 5.

Next, referring to step S2 in FIG. 5 and as shown in FIGS. 8 and 9, partition layers 12 are formed on the first pixel definition layers 11d, and etching openings 120 are provided in the partition layers 12. FIG. 9a is a cross-sectional view taken along line CC in FIG. 8.

The step S2 may include: forming a partition material layer on the first electrodes 11a and the first pixel definition layers 11d; and patterning the partition material layer to form the partition layers 12 to expose the first electrodes 11a and the first pixel definition layers 11d in partial regions of the first non-pixel regions 10b.

The patterning of the partition material layer can be achieved by first performing a photolithography process and then performing dry etching or wet etching.

A material of the partition material layer can be at least one of indium tin oxide (ITO), indium gallium zinc oxide (IGZO), indium zinc oxide (IZO), aluminum-doped zinc oxide (AZO), molybdenum or aluminum-molybdenum-aluminum (Al—Mo—Al) laminate. In an embodiment, the patterning is performed by wet etching.

When the material of the partition material layer is at least one of ITO, IGZO, IZO, or AZO, a solution for wet etching is oxalic acid. In one embodiment, although the material of the first electrodes 11a is also ITO, the ITO of the first electrodes 11a is subjected to high temperature annealing treatment. Oxalic acid can only corrode ITO that has not been subjected to high temperature annealing treatment, that is, uncrystallized ITO, and cannot corrode ITO that has been subjected to high temperature annealing treatment, that is, crystalline ITO. Therefore, the performance of the first electrodes 11a will not be affected when the partition material layer is corroded.

When the material of the partition material layer is molybdenum or aluminum-molybdenum-aluminum laminate, a mixture of nitric acid, acetic acid, and phosphoric acid is used for wet etching.

As shown in FIGS. 8 and 9, in addition to removing the partition material layer in a region of etching openings 120 (configured to form the openings 110 shown in FIG. 10), in order to increase the light transmittance of the transparent display region 1a, the partition material layer in other regions of the first non-pixel regions 10b can be further removed to the extent that the partition material layer in the region adjacent to the etching openings 120 are retained.

In this embodiment, the partition layers 12 extend along the row direction. In other embodiments, the partition layers 12 may extend along the column direction. When the display substrate 1 emits light in an AM driving mode, the partition layers 12 may be block-shaped.

In addition, in this embodiment, as shown in FIG. 8, the partition layers 12 in one non-pixel region 10b are two partition layers 12 extending along the row direction. In other embodiments, there may be one or three or more partition layers 12.

Figure 10:
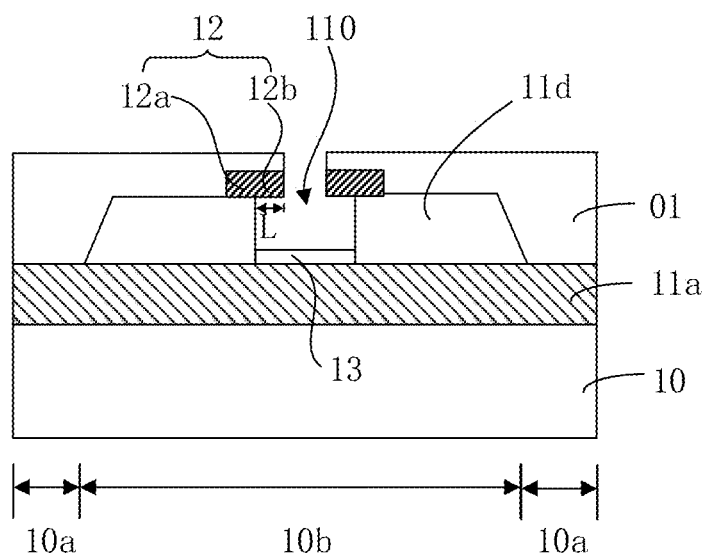
FIG. 10 is a schematic diagram of intermediate structures corresponding to the processes in FIG. 5.
Figure 11:
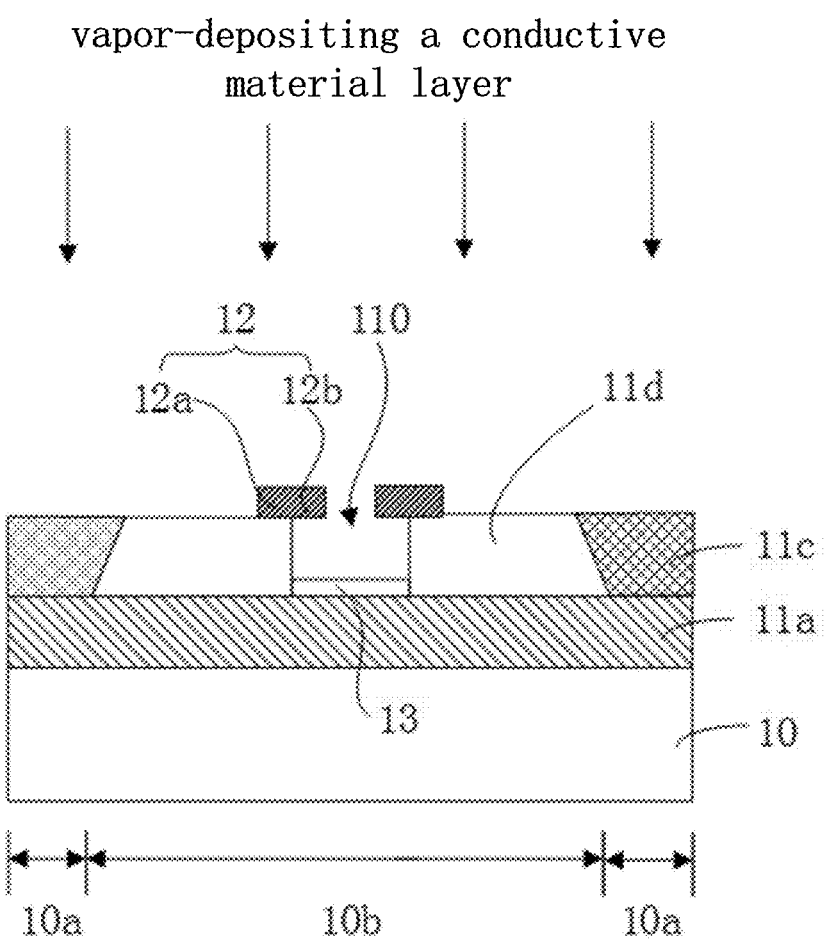
FIG. 11 is a schematic diagram of intermediate structures corresponding to the processes in FIG. 5.

Then, referring to step S3 in FIG. 5 and as shown in FIG. 10, a patterned mask layer 01 is formed on the partition layers 12 and a part of the first electrodes 11a and a part of the first pixel definition layers 11d which are not covered by the partition layers 12, and the patterned mask layer 01 exposes the etching openings 120. The first pixel definition layers 11d are etched with the patterned mask layer 01 as a mask to form openings 110, so that a part of the partition layers 12 is suspended. Referring to FIG. 11, the patterned mask layer 01 is removed.

Forming the patterned mask layer 01 may include: first, forming a mask material layer on the partition layers 12 and a part of the first electrodes 11a and a part of the first pixel definition layers 11d that are not covered by the partition layers 12, where a material of the mask material layer may be photoresist; and then exposing and developing the photoresist.

a) In an optional embodiment, in step S3, that the first pixel definition layers 11d are etched with the patterned mask layer 01 as a mask to form openings 110 may include: first, performing anisotropic dry etching to form initial openings, which penetrate through the first pixel definition layers 11d or partially penetrate through the first pixel definition layers 11d; and then, performing isotropic dry etching to transversely expand the initial openings to form openings 110 that suspend a part of the partition layers 12. The transverse direction is parallel to a plane direction where the first substrate 10 is disposed.

The anisotropy can be achieved by applying a bias voltage between a plasma generation source and a carrier base, and the isotropy can be achieved by removing the above-mentioned bias voltage.

When the first pixel definition layers 11d are made of inorganic material, for example, silicon dioxide or silicon nitride, a dry etching gas may be fluorine-containing gas such as $CF_4$ and/or $C_3F_8$. When the first pixel definition layers 11d are made of organic material, for example, polyimide, the dry etching gas may be fluorine-containing gas such as $CF_4$ and/or $C_3F_8$ mixed with oxygen.

b) In an optional embodiment, in step S3, that the first pixel definition layers 11d are etched with the patterned mask layer 01 as a mask to form openings 110 may include: first, performing anisotropic dry etching to form initial openings, which penetrate through the first pixel definition layers 11d or partially penetrate through the first pixel definition layers 11d; and then, performing wet etching to transversely expand the initial openings to form openings 110 that suspend a partial section of the partition layers 12.

When the first pixel definition layers 11d are made of inorganic material, for example, silicon dioxide, a solution for wet etching is hydrofluoric acid (HF). When the first pixel definition layers 11d are made of inorganic material, for example, silicon nitride, a solution for wet etching is hot phosphoric acid.

c) In an optional embodiment, in step S3, that the first pixel definition layers 11d are etched with the patterned mask layer 01 as a mask to form openings 110 may include: alternately performing anisotropic and isotropic dry etching a plurality of times to form openings 110. Performing isotropic dry etching may transversely expand the formed openings to suspend a partial section of the partition layers 12.

In other optional embodiments, the openings 110 that suspend a partial section of the partition layers 12 can be formed by selecting the etching gas, process conditions, etc.

The patterned mask layer 01 may be photoresist, which may be removed by an ashing method.

In each partition layer 12, a section disposed on the first pixel definition layer 11d is denoted as a first section 12a, and a section suspending above the opening 110 is denoted as a second section 12b.

In step S3, the first pixel definition layers 11d are etched to form the openings 110, so that a partial section of the partition layers 12 is suspended, and at the same time, the pixel definition layers can also be removed to expose the pixel electrodes. Among others, the first pixel definition layers 11d in the first pixel regions 10a are removed to expose the first electrodes 11a. In other words, the pixel definition layers in the semiconductor structure 1p in step S1 have not been patterned, among others, the first pixel definition layers 11d have not been patterned. In this embodiment, the first electrodes 11a are exposed and the openings 110 are formed at the same time during the patterning process of the pixel definition layers.

After that, light-emitting structure layers are formed on the pixel electrodes. Referring to step S4 in FIG. 5 and as shown in FIG. 11, the light-emitting structure layers include first light-emitting structure layers 11c formed on the exposed first electrodes 11a.

The first light-emitting structure layers 11c may be OLED layers, which are formed by vapor deposition method. In an optional embodiment, a portion of a mask for vapor deposition corresponding to the first substrate 10 has a plurality of openings, and each opening corresponds to one first electrode 11a. In other optional embodiment, the mask for vapor deposition has one opening corresponding to the transparent display region 1a, and the first light-emitting structure layers 11c on the first electrodes 11a are separated by the first pixel definition layer 11d.

A plurality of first sub-pixels 11 can form one first pixel unit. The first light-emitting structure layers 11c in each first pixel unit may be red, green, and blue and alternately disposed. In other optional embodiments, the first light-emitting structure layer 11c in each first pixel unit may be red, green, blue, and yellow and alternately disposed, which is not limited in the present disclosure.

Then, referring to step S5 in FIG. 5, and as shown in FIG. 11, and FIG. 2a, a conductive material layer is vapor deposited, and the conductive material layer includes a plurality of second electrodes 11b formed by being separated by the partition layers 12.

A mask for vapor deposition of the second electrodes 11d has one opening corresponding to the transparent display region 1a.

With the manufacturing method of the display substrate provided in the present application, the second sections 12b of the partition layers 12 are suspended, which has a good partition effect on the conductive material layer, and the second electrodes 11b of the adjacent first sub-pixels 11 will not be electrically connected with each other. The electrode strips in the first non-pixel regions 10b have insulating layers 13 thereon, which can further prevent the conductive material layer falling on the first light-transmitting substrate 10 from electrically connecting the electrode strips formed by the first electrodes 11a of each column.

Figure 12:
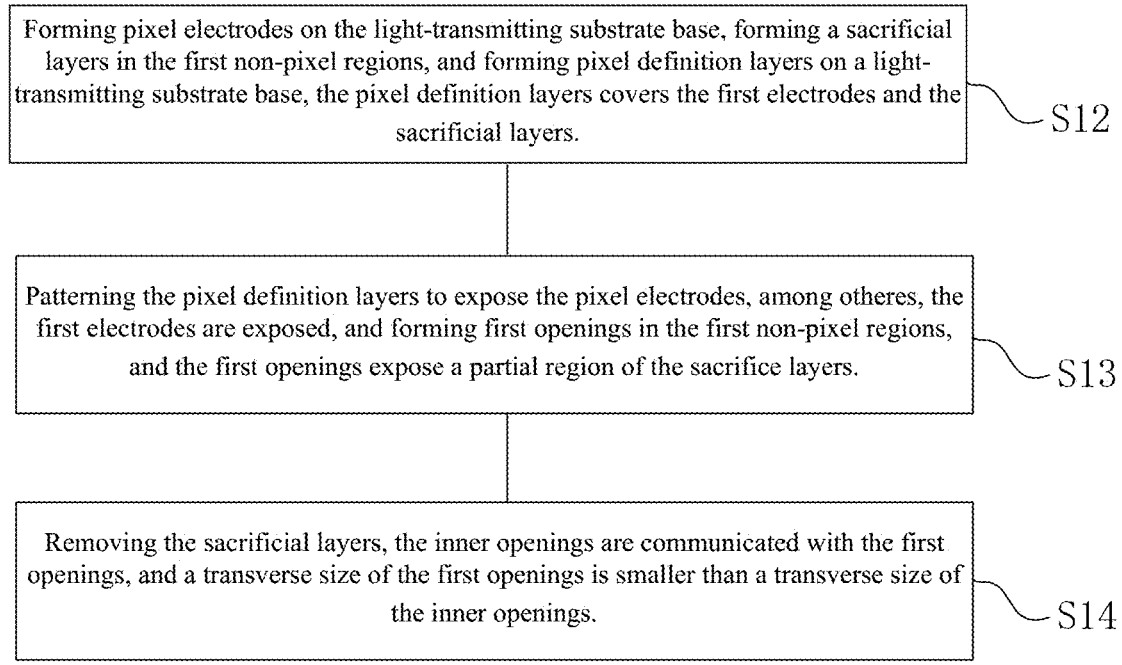
FIG. 12 is a flowchart showing a manufacturing method of the display substrate according to another embodiment of the present application.
Figure 13:
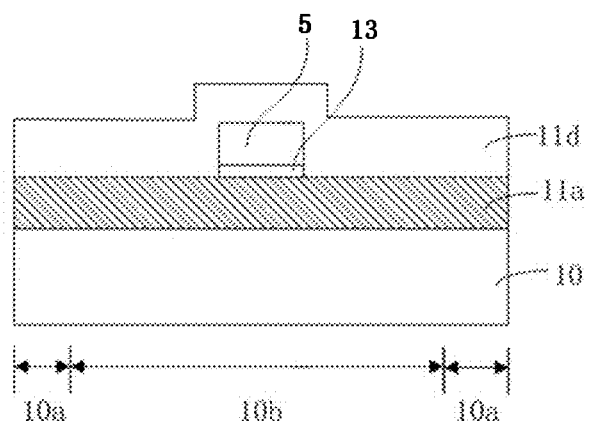
FIG. 13 is a schematic diagram of intermediate structures corresponding to the processes in FIG. 12.
Figure 14:
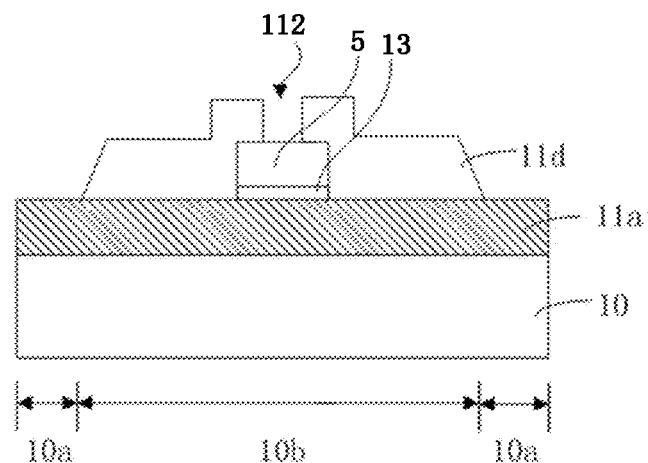
FIG. 14 is a schematic diagram of intermediate structures corresponding to the processes in FIG. 12
Figure 15:
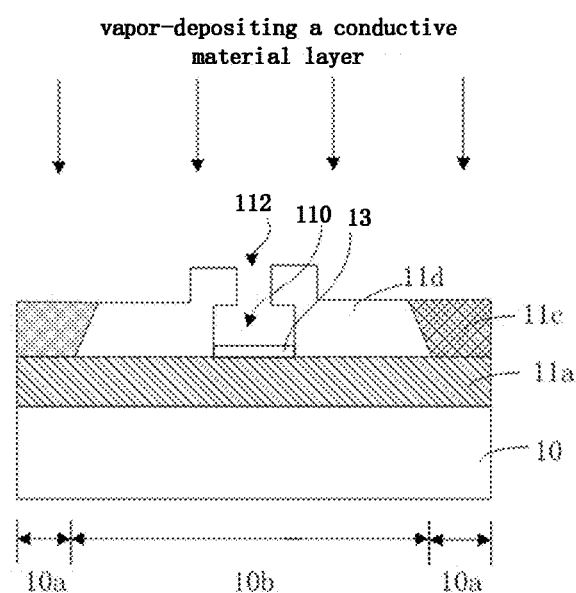
FIG. 15 is a schematic diagrams of intermediate structures corresponding to the processes in FIG. 12

FIGS. 13 to 15 are schematic diagrams of intermediate structures corresponding to the processes in FIG. 12. When the partition layers are a part of the first pixel definition layers, the manufacturing method of the display substrate further includes steps S12 to S14. Before the semiconductor structure 1p is provided, the method further includes a step of manufacturing the semiconductor structure. In the manufacturing step S12 of the semiconductor structure, as shown in FIG. 12 and FIG. 13, pixel electrodes are formed on the light-transmitting substrate, and the pixel electrodes include first electrodes 11a in the first pixel regions 10a; sacrificial layers 5 are formed in the first non-pixel regions 10b; and pixel definition layers are formed on a light-transmitting substrate. The pixel definition layers include first pixel definition layers 11d on the first substrate 10, and the first pixel definition layers 11d cover the first electrodes 11a and the sacrificial layers 5. For example, as shown in FIGS. 12 and 13, the first electrodes 11a are also formed in the first non-pixel regions 10b, and the sacrificial layers 5 are formed on a portion of the first electrodes 11a disposed in the first non-pixel regions 10b. In step S13, as shown in FIG. 14, the pixel definition layers are patterned to expose the pixel electrodes, among others, the first electrodes 11a are exposed, and first apertures 112 are formed in the first non-pixel regions 10b. The first apertures 112 expose a partial region of the sacrifice layers 5. In step S14, as shown in FIG. 15, that the first pixel definition layers 11d are etched with a patterned mask layer as a mask to form openings 110 that suspends a partial section of the partition layers 12 includes removing the sacrificial layers 5. The openings 110 are communicated with the first apertures 112, and a transverse size of the first apertures 112 is smaller than a transverse size of the openings 110.

A material of the sacrificial layers 5 may be ITO and/or indium gallium zinc oxide (IGZO). Alternatively, the material of the sacrificial layers 5 may be molybdenum. The sacrificial layers 5 can be patterned by depositing a sacrificial material on the entire surface, and then performing dry etching or wet etching.

In this embodiment, the sacrificial layers 5 extend along the row direction and are disposed above, for example, the electrode strips in the first non-pixel regions 10b. In other embodiments, the sacrificial layers 5 may extend along the column direction. When the display substrate 1 emits light in the AM driving mode, the sacrificial layers 5 may be block structures.

Before forming the sacrificial layers 5, insulating layers 13 are formed at least on, for example, the electrode strips in the first non-pixel regions 10b. A material of the insulating layers 13 may be at least one of silicon dioxide or silicon nitride. The insulating layers 13 can be patterned by depositing a sacrificial material on the entire surface and then performing dry etching or wet etching. To reduce process steps, the insulating layers 13 and the sacrificial layers 5 can be patterned in a same process.

In step S13, the etching openings are exposed from the patterned mask layer. That is, as shown in FIG. 14, first apertures 112 are formed in the first non-pixel regions 10b to expose a partial region of the sacrificial layers 5. After the sacrificial layer 5 is removed, as shown in FIG. 14, a first aperture 112 and an opening 110 form an opening structure with a narrow top and a wide bottom.

In the case where the semiconductor structure includes a sacrificial layer, when the first pixel definition layer 11b is made of an inorganic material, such as silicon dioxide or silicon nitride, the patterning may be achieved by first performing a photolithography process and then performing dry etching; when the first pixel definition layer 11b is made of an organic material, for example, such as polyimide, the patterning may be achieved by a photolithography process.

In this embodiment, the first apertures 112 extend along the row direction. In other embodiments, the first aperture 112 may extend along the column direction. When the display substrate 1 emits light in an AM driving mode, the first apertures 112 may be block-shaped.

When the material of the sacrificial layers 5 is ITO and/or IGZO, the sacrificial layers 5 are removed by oxalic acid. Although the material of the first electrodes 11a may also be ITO, the ITO of the first electrodes 11a has been subjected to high temperature annealing treatment. Oxalic acid can only corrode ITO that has not been subjected to high temperature annealing treatment, and cannot corrode ITO that has been subjected to high temperature annealing treatment. Therefore, when the sacrificial layers 5 are removed, the performance of the first electrodes 11a will not be affected.

When the material of the sacrificial layers 5 is molybdenum, the sacrificial layers 5 are removed with a mixed solution of nitric acid, acetic acid, and phosphoric acid.

The manufacturing method of the display substrate according to an embodiment of the present application further includes manufacturing the semiconductor structure 1p. In the production process of the semiconductor structure 1p, at the same time that the first electrodes 11a are formed in the first pixel regions 10a, first electrodes 11a are formed in a region of the first non-pixel regions 10b adjacent to the first pixel regions 10a. In a first non-pixel region 10b, an orthographic projection of the first electrode 11a on the first substrate 10 does not overlap with an orthographic projection of the opening 110 to be formed.

With the manufacturing method of the display substrate provided in the present application, the transverse size of the first apertures 112 is smaller than the transverse size of the openings 110. Thus, the opening structure with a narrow top and a wide bottom has a good isolation effect on the conductive material layer. The second electrodes 11b of adjacent first sub-pixels 11 will not be electrically connected with each other.

Figure 16:
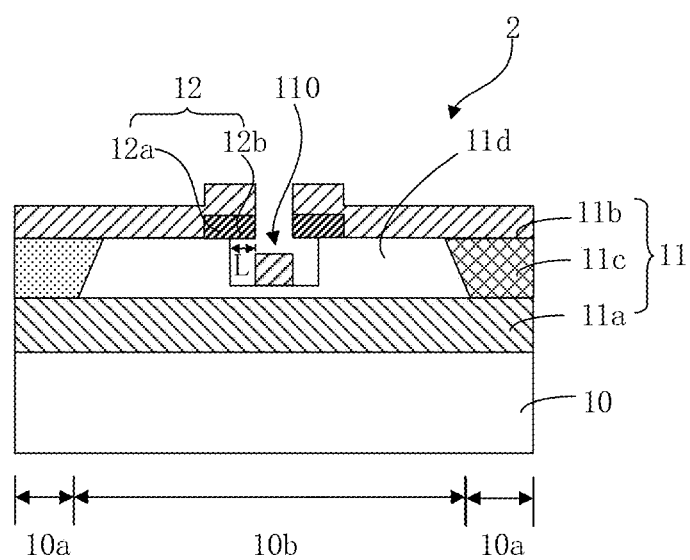
FIG. 16 is a cross-sectional diagram of a display substrate corresponding to a transparent display region in another embodiment of the present application.

FIG. 16 is a schematic diagram of a cross-sectional structure of a display substrate corresponding to a transparent display region in another embodiment of the present application. Referring to FIG. 16, the structure of the display substrate 2 in this embodiment is substantially the same as that of the display substrate 1 in FIGS. 1, 2a and 2b, except that the openings 110 partially penetrate the first pixel definition layers 11d in the longitudinal direction.

In this embodiment, the first pixel definition layers 11d that are not penetrated can play an insulating role, and can prevent the conductive material layer falling into the openings from being electrically connected with structures such as the first electrodes 11a. When the display substrate 2 in this embodiment is manufactured, the manufacturing of the insulating layers 13 may be omitted. In other words, the semiconductor structure 1p in step S1 may be an intermediate structure of an existing process, which has a good compatibility with the existing processes.

In the etching process of the openings 110, a depth of the openings 110 can be controlled by a length of the etching time.

Figure 17:
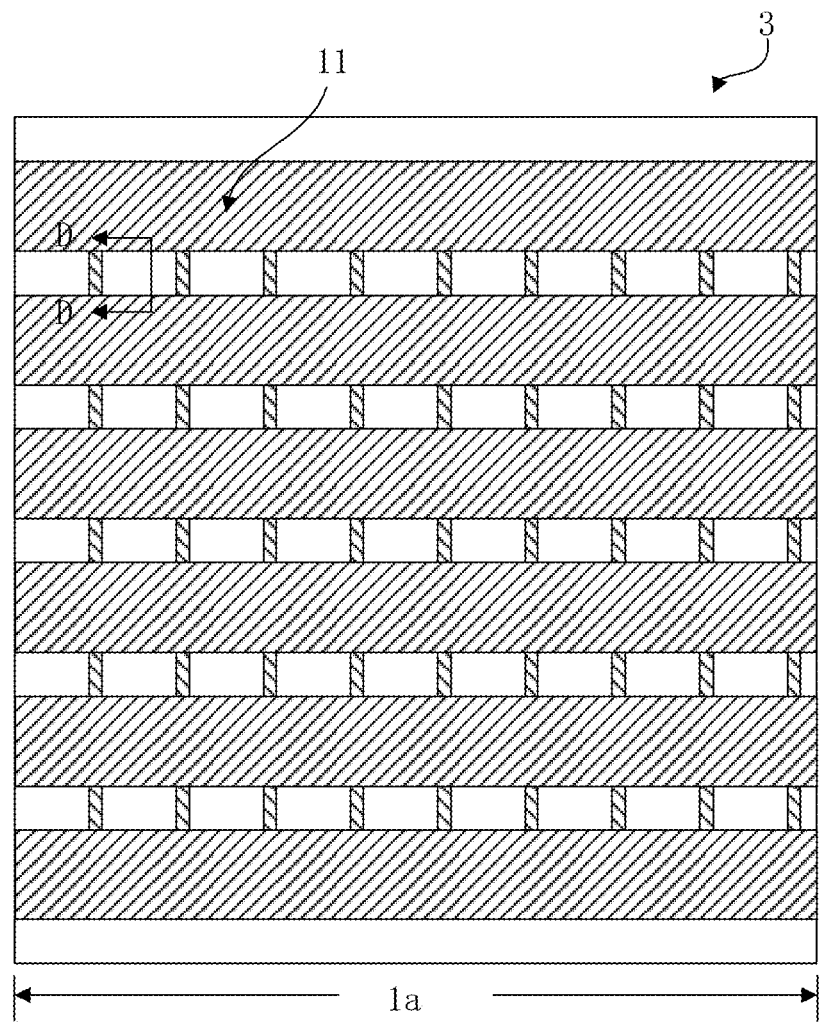
FIG. 17 is a top view of a display substrate corresponding to a transparent display region in yet another embodiment of the present application.
Figure 18A:
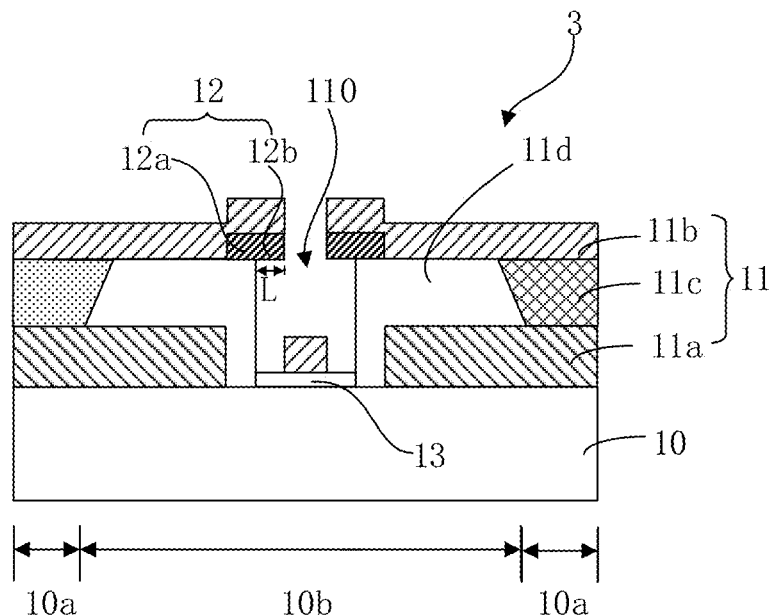
FIG. 18*a* is a cross-sectional view taken along line D-D in FIG. 17.
Figure 18B:
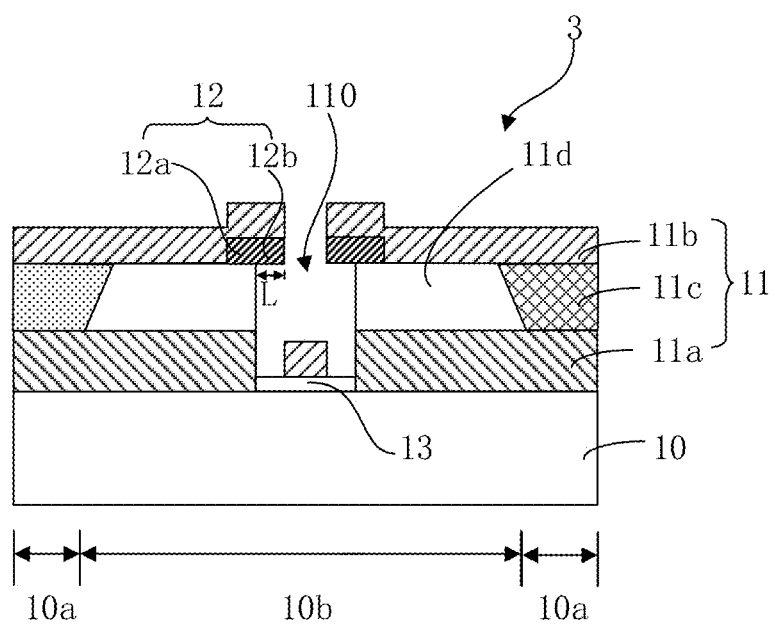
FIG. 18*b* is a schematic diagram of a variant structure of first sub-pixel in FIG. 18*a*.
Figure 19:
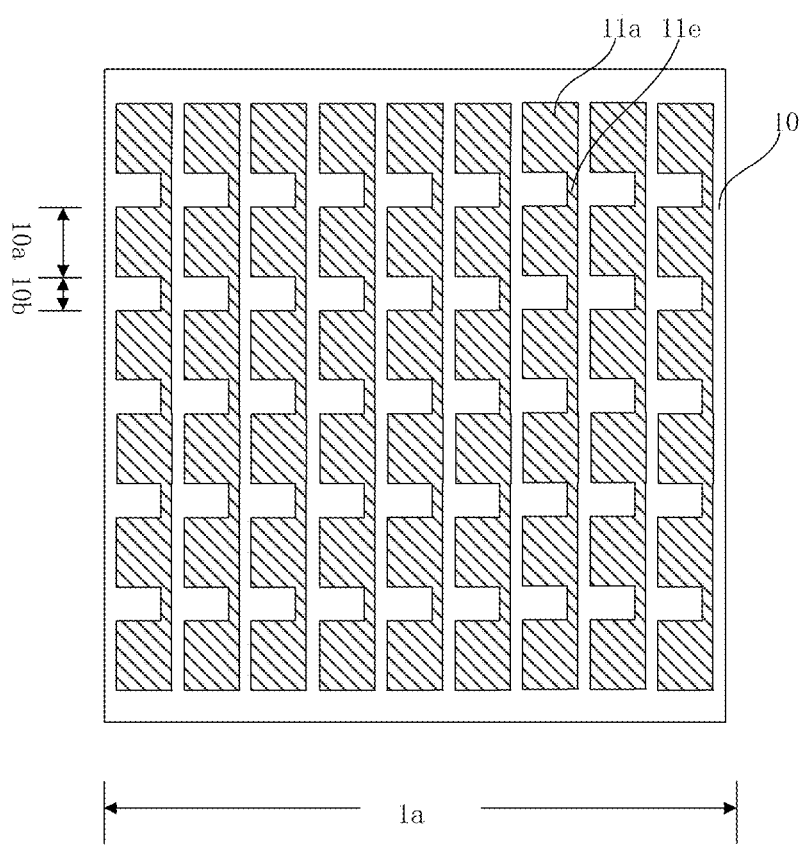
FIG. 19 is a diagram depicting distribution of first electrodes of the display substrate in FIG. 17.

FIG. 17 is a top view of a display substrate in another embodiment of the present application. FIG. 18a is a cross-sectional view taken along line DD in FIG. 17. FIG. 18b is a schematic diagram of a variant structure of first sub-pixel in FIG. 18a. FIG. 19 is a diagram depicting distribution of first electrodes of the display substrate in FIG. 17.

Referring to FIGS. 17 to 19, the structure of the display substrate 3 in this embodiment is substantially the same as that of the display substrate 1 in FIGS. 1, 2a and 2b, except that connecting lines 11e are provided between adjacent first electrodes 11a in one column. The connecting lines 11e are configured to connect the first electrodes 11a in one column together; and insulating layers 13 are provided on the connecting lines 11e.

In FIG. 19, the connecting lines 11e are straight lines and are aligned with one side of the first electrodes 11a. In other optional embodiments, the connecting lines 11e may be broken lines or curves, and/or connected with one side or a middle of the first electrodes 11a.

In other embodiments, when the first electrodes of the first sub-pixels in one row are connected together, connection lines are provided between adjacent first electrodes in one row, and the connection lines are configured to connect the first electrodes in one row together.

The insulating layers 13 on the connecting lines 11e can prevent the conductive material layer falling on the first substrate 10 from electrically connecting the first electrodes 11a of the columns.

In this embodiment, referring to FIGS. 18a and 18b, the first electrodes 11a may extend to the first non-pixel regions 10b. The first electrodes 11a in the first non-pixel regions 10b may be as shown in FIG. 18a. The first pixel definition layer 11d buries the first electrodes in the first non-pixel regions 10b and there is a gap between adjacent first electrode in the first non-pixel region 10b and a sidewall of the opening 110. Alternatively, the first electrodes 11a in the first non-pixel regions 10b may be exposed in the opening 110 as shown in FIG. 18b, for example, the first electrodes extend to the sidewalls of the opening 110. The periphery of the opening 110 may be provided with a suspended partition layer 12, so that conductive material layer falling on the first substrate 10 is not connected with the first electrodes 11a. For example, in the same first non-pixel region 10b, by controlling a relative positional relationship between the first aperture 112 and the opening 110, an orthographic projection of the first aperture 112 on the first substrate 10 is within an orthographic projection of the opening 110 on the first substrate 10. Therefore, the conductive material layer falling on the first substrate 10 is not connected with the first electrodes 11a.

The embodiment in FIG. 16 can be incorporated into this embodiment.

Figure 20:
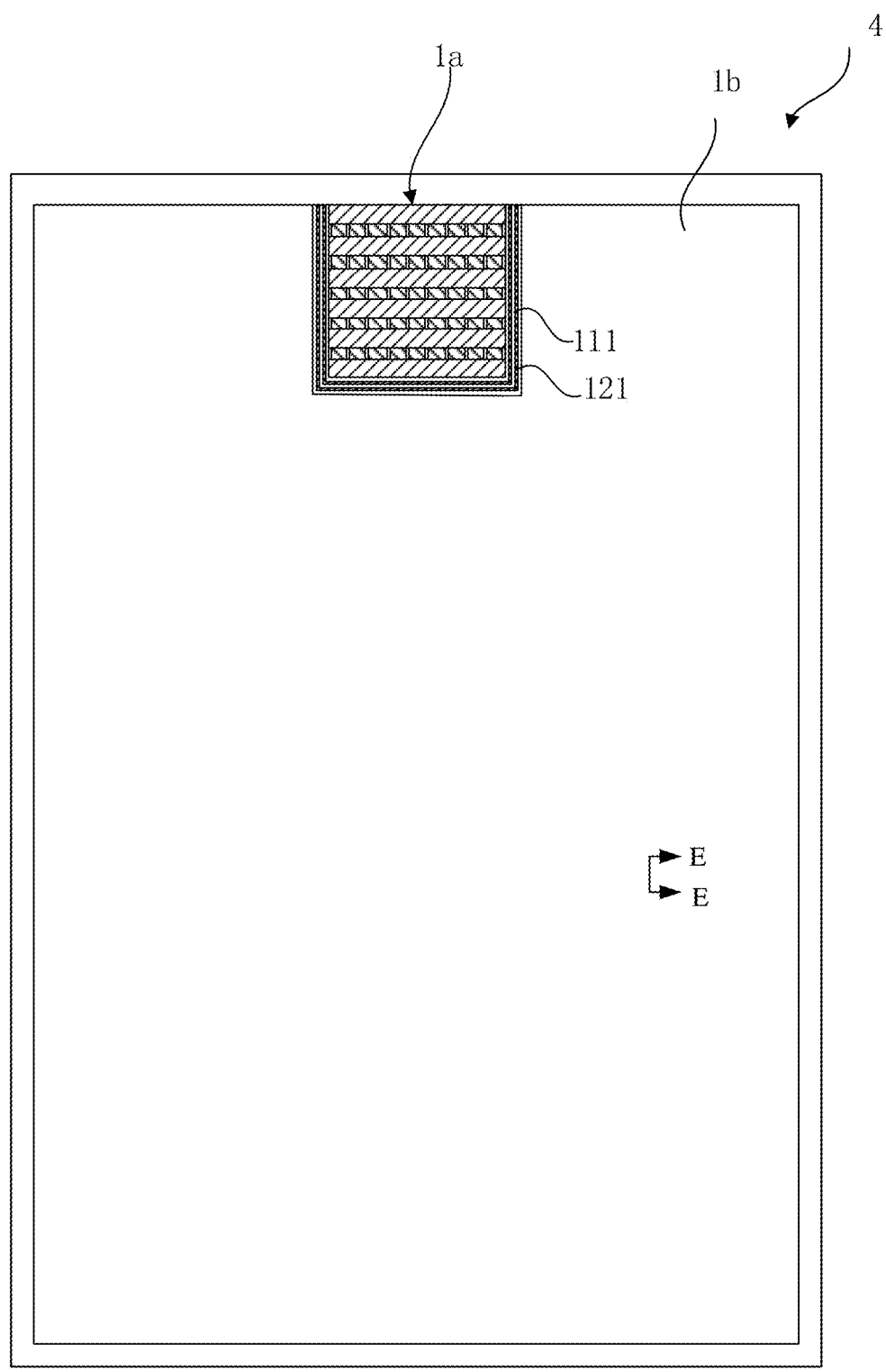
FIG. 20 is a top view of a display substrate in still another embodiment of the present application.
Figure 21:
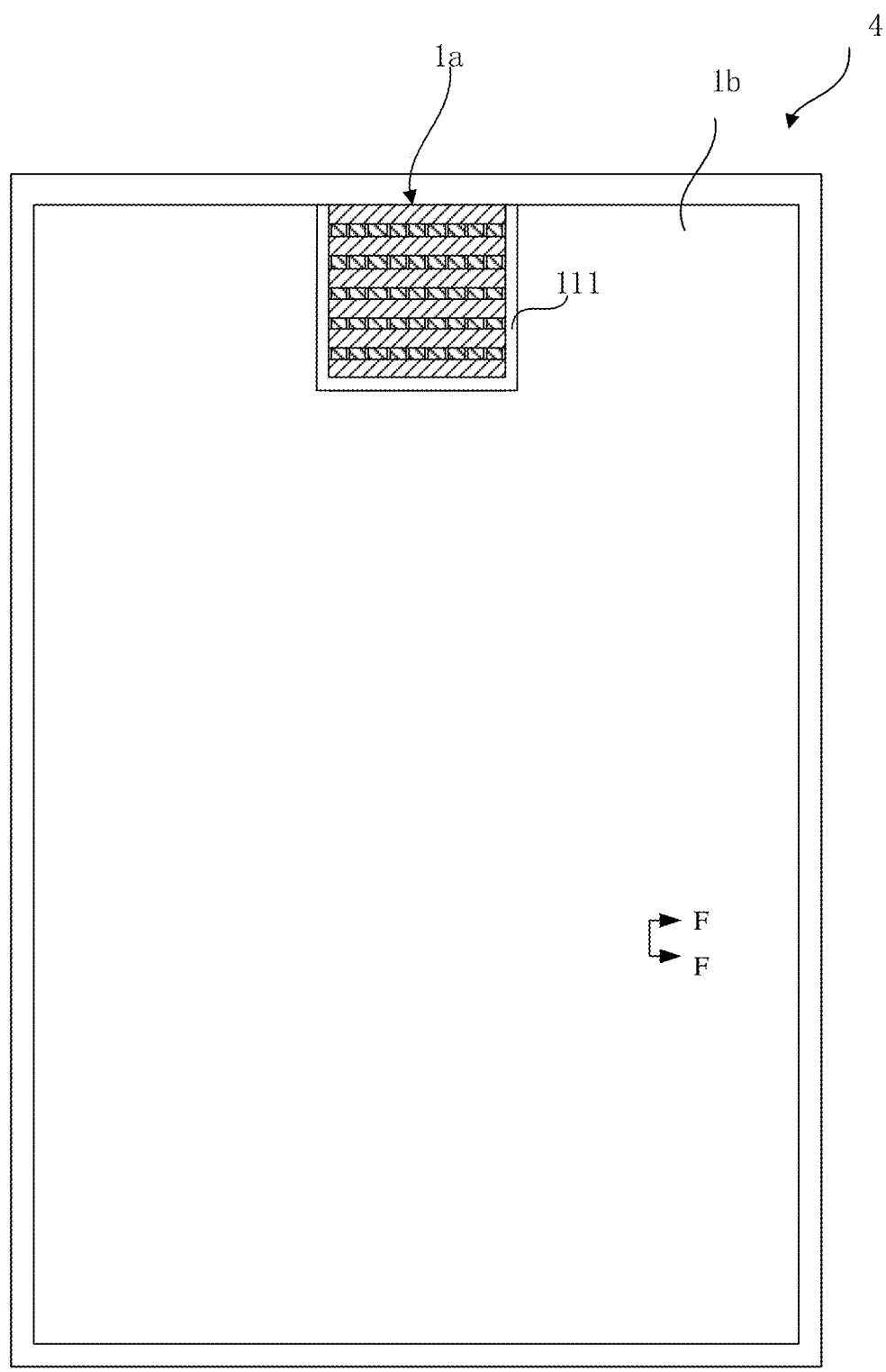
FIG. 21 is a top view of a display substrate in still another embodiment of the present application.

FIG. 20 is a top view of a display substrate in another embodiment of the present application. FIG. 21 is a top view of a display substrate in another embodiment of the present application. FIG. 22 is a schematic diagram of a partial cross-sectional structure of a non-transparent display region in FIGS. 20 and 21.

Referring to FIG. 20, the display substrate 4 in this embodiment has substantially the same structure as the display substrate 1 in FIGS. 1, 2a and 2b, the display substrate 2 in FIG. 16 and the display substrate 3 in FIGS. 17 to 19, except that: the display substrate 4 further includes a non-transparent display region 1b that at least partially surrounds the transparent display region 1a.

Referring to FIGS. 20-22, the non-transparent display region 1b may include a second substrate 15, which is a part of a light-transmitting substrate, the second substrate 15 including a plurality of second pixel regions 10c and a plurality of second non-pixel regions 10d alternately distributed; second sub-pixels 14 disposed in the second pixel regions 10c, each of the second sub-pixels 14 including a third electrode 14a, a second light-emitting structure layer 14c disposed on the third electrode 14a, and a fourth electrode 14b disposed on the second light-emitting structure layer 14c from bottom to top; and second pixel definition layers 14d disposed in the second non-pixel regions 10d.

The third electrode 14a may be one of an anode and a cathode, and the fourth electrode 14b is the other one of the anode and the cathode. A material of the third electrode 14a is a reflective material. A material of the fourth electrode 14b is a material that is partially light-transmitting and partially reflective. The second light-emitting structure layer 14c may be an OLED layer.

A plurality of second sub-pixels 14 can form one second pixel unit. The second light-emitting structure layers 11c in each second pixel unit may be red, green or blue and alternately arranged. In other optional embodiments, the second light-emitting structure layers 11c in each second pixel unit may be red, green, blue, or yellow and alternately arranged, which is not limited in the present disclosure.

The second sub-pixels 14 may emit light in an AM driving mode, or may emit light in a PM driving mode. When the second sub-pixels 14 emit light in the AM driving mode, the third electrodes 14a are block electrodes. When the second sub-pixels 14 emit light in the PM driving mode, the third electrodes 14a are strip electrodes extending in a row (or column) direction. Correspondingly, the fourth electrodes 14b are also strip electrodes extending in a column (or row) direction, and an intersection of the row and the column is one second sub-pixel 14.

When the second sub-pixels 14 emit light in the AM driving mode, the fourth electrodes 14b may be a planar electrode to simplify a pattern structure of the fourth electrodes 14b and increase the light transmittance.

In an optional embodiment, as shown in FIG. 20, a partition strip 121 is provided on a part of the transparent display region 1a adjacent to the non-transparent display region 1b, and an opening area 111 is provided on a part of the first pixel definition layer 11d adjacent to the non-transparent display region 1b. The partition strip 121 includes a first portion and a second portion. The first portion is disposed on the first pixel definition layer 11d, and the second portion is suspended above the opening area 111 to separate the second electrodes 11b of the transparent display region 1a and the fourth electrodes 14b of the non-transparent display region 1b. With the above embodiments, the opening pattern of a mask for vapor deposition of the second electrodes 11b and the fourth electrodes 14b can be simplified.

In an embodiment, a size of a longitudinal section of the partition strip 121 along a direction perpendicular to an extending direction thereof is the same as a size of a longitudinal section of the partition layer 12, and the longitudinal section of the partition layer 12 is in the same direction as the longitudinal section of the partition strip. The opening area 111 may include a plurality of openings 110 connected together. A size of a longitudinal section of the opening area 111 along a direction perpendicular to an extending direction thereof is the same as a size of a longitudinal section of the opening 110, and the longitudinal section of the opening 110 is in the same direction as the longitudinal section of the opening area 111. In other examples, the size of the longitudinal section of the opening area 111 may be different from the size of the longitudinal section of the opening 110, and the two can be made compatibly or made separately.

As shown in FIG. 21, when the partition layer is a part of the first pixel definition layer, the first pixel definition layer 11d of the transparent display region 1a has an opening area 113, which includes a first aperture area and an inner opening area 111 from top to bottom, and the opening area 111 communicates with the first aperture strip. A transverse size of the first aperture strip perpendicular to an extending direction thereof is smaller than the transverse size of the opening area 111 perpendicular to an extending direction thereof, to separate the second electrodes 11b of the transparent display region 1a from the fourth electrodes 14b of the non-transparent display region 1b.

In addition, when the non-transparent display region 1b completely surrounds the transparent display region 1a, the partition strip 121 and the opening area 111 are closed loops. When the non-transparent display region 1b partially surrounds the transparent display region 1a, the partition strip 121 and the opening area 111 are non-closed loops, as shown in FIG. 20.

In other optional embodiments, the separation between the second electrodes 11b and the fourth electrodes 14b can be achieved by an opening pattern of a mask used in vapor deposition of the second electrodes 11b and the fourth electrodes 14b.

In the manufacturing process, on the display substrates 1, 2, 3, or 4, an encapsulation layer, a polarizer, and a cover plate can be successively manufactured to form a display panel.

In an optional embodiment, the encapsulation layer can be a three-layer structure of an inorganic layer, an organic layer, and an inorganic layer.

For the display substrates 1, 2, 3, or 4, the transparent display region 1a and the non-transparent display region 1b are encapsulated in a same process.

The polarizer may be only arranged in the non-transparent display region 1b.

Based on the above display panel, an embodiment of the present application further provides a display device.

The display device may be a display device such as a mobile phone, a tablet computer, a vehicle display screen, and the like.

The display device includes: a device body having a component region; and a display panel covering the device body. The display panel includes any of the above-mentioned display substrates 1, 2, 3, or 4. The component region is disposed below the transparent display region 1a of the display panel, and one or more photosensitive components that emit or collect light through the transparent display region 1a are arranged in the component region.

The one or more photosensitive components include a camera and/or a light sensor. The light sensor includes one or a combination of an iris recognition sensor and a fingerprint recognition sensor.

Although the present disclosure is disclosed as above, the present disclosure is not limited thereto. Any person skilled in the art can make various changes and amendments without departing from the spirit and scope of the present disclosure. Therefore, the protection scope of the present disclosure should be based on the scope defined in the claims.

The invention claimed is:

1. A display substrate, defining a display region having a transparent display region and a non-transparent display region at least partially surrounding the transparent display region, the display substrate comprising:
    a light-transmitting substrate comprising:
        a first substrate disposed in the transparent display region comprising a plurality of first pixel regions and a plurality of first non-pixel regions alternately distributed; and
        a second substrate disposed in the non-transparent display region comprising a plurality of second pixel regions and a plurality of second non-pixel regions alternately distributed;
    a plurality of first sub-pixels, at least one of the plurality of first sub-pixels disposed in each of the first pixel regions of the transparent display region, and each first sub-pixel of the plurality of first sub-pixels comprising, from bottom to top, a first electrode, a first light-emitting structure layer disposed on the first electrode and a second electrode disposed on the first light-emitting structure layer, wherein a material of the second electrode is a material that is partially light-transmitting and partially reflective;
    a plurality of second sub-pixels, disposed in the plurality of second pixel regions of the non-transparent display region, each of the second sub-pixels comprising, from bottom to top, a third electrode, a second light-emitting structure layer disposed on the third electrode, and a fourth electrode disposed on the second light-emitting structure layer;
    a first pixel definition layer, disposed in the plurality of first non-pixel regions and provided with a plurality of openings;
    a second pixel definition layer, disposed in the plurality of second non-pixel regions of the non-transparent display region; and
    a plurality of partition layers, at least one partition layer of the plurality of partition layers disposed in each of the first non-pixel regions of the transparent display region, wherein each partition layer of the plurality of partition layer comprises a first section and a second section, the first section is disposed on the first pixel definition layer, and the second section is suspended above a corresponding one of the openings to partition the second electrodes of adjacent first pixel regions.

2. The display substrate according to claim 1, wherein in a same first non-pixel region, the partition layer is a part of the first pixel definition layer and comprises at least two sub-partition layers, a first aperture is formed between the at least two sub-partition layers, and the opening is communicated with the first aperture, and a transverse size of the first aperture is smaller than a transverse size of the opening.

3. The display substrate according to claim 2, wherein an orthographic projection of the first aperture on the first substrate is at least partially located within an orthographic projection of the opening on the first substrate.

4. The display substrate according to claim 1, wherein the openings penetrate or partially penetrate the first pixel definition layer in a longitudinal direction.

5. The display substrate according to claim 2, wherein the first pixel definition layer comprises a first sidewall disposed in the first aperture and a second sidewall disposed in the opening, the first sidewall and the second sidewall are adjacent to a same first pixel region, a distance between an orthographic projection of the first sidewall on the first substrate and an orthographic projection of the second sidewall on the first substrate ranges between 0.5 and 3.5 µm; and a thickness of the second section ranges between 50 nm and 100 nm.

6. The display substrate according to claim 1, wherein a depth of the openings is at least greater than a thickness of the second electrodes.

7. The display substrate according to claim 1, wherein a material of the first pixel definition layer is an inorganic transparent material or an organic transparent material.

8. The display substrate according to claim 1, wherein the first sub-pixels emit light in a passive matrix (PM) driving manner; the first electrodes of the first sub-pixels disposed in a first direction are electrically connected with each other, the second electrodes of the first sub-pixels disposed in a second direction are electrically connected with each other, and the at least one partition layer in each of the first non-pixel regions and the openings extend along the second direction; one of the first direction and the second direction is a column direction, the other is a row direction.

9. The display substrate according to claim 8, wherein connecting lines are provided between adjacent first electrodes located in one column or one row to connect the corresponding first electrodes in one column or one row; an insulating layer is provided on the connecting lines and exposed in the openings; or the first electrodes in one column or one row are connected to form an electrode strip, and a portion of the electrode strip located in the first non-pixel regions is provided with an insulating layer exposed in the openings.

10. The display substrate according to claim 1, wherein portions of the first electrodes extending into adjacent first non-pixel regions are covered by the first pixel definition layer, and in a same first non-pixel region, a gap is disposed between the first electrode and a sidewall of the opening in the first non-pixel region, or the first electrode is exposed in the opening.

11. The display substrate according to claim 1, wherein, when the plurality of second sub-pixels is configured to emit light in an active matrix (AM) driving mode, the third electrode is a block electrode, and the fourth electrode is a planar electrode.

12. The display substrate according to claim 1, wherein a partition strip is provided on the transparent display region adjacent to the non-transparent display region, an opening area is provided on the first pixel definition layer adjacent to the non-transparent display region, the partition strip comprises a first portion and a second portion, the first portion is disposed on the first pixel definition layer, and the second portion is suspended above the opening area to separate the second electrode of the transparent display region from the fourth electrode of the non-transparent display region.

13. The display substrate according to claim 12, wherein a size of a longitudinal section of the partition strip along a direction perpendicular to an extending direction thereof is the same as a size of a longitudinal section of the partition layers, and a size of a longitudinal section of the opening area along a direction perpendicular to an extending direction thereof is the same as a size of a longitudinal section of the openings; wherein the longitudinal section of the partition layer is parallel or coplanar with the longitudinal section of the partition strip, and the longitudinal section of the openings is parallel or coplanar with the longitudinal section of the opening area.

14. A display device, comprising:
a device body, having a component region, and
a display panel, covering the device body and comprising the display substrate according to claim 1, wherein the component region is disposed below a transparent display region of the display panel, and one or more photosensitive components that emit or collect light through the transparent display region is arranged in the component region of the device body.

* * * * *